US007022437B2

(12) United States Patent
Cummings

(10) Patent No.: US 7,022,437 B2
(45) Date of Patent: Apr. 4, 2006

(54) PERFLUOROPOLYETHER LIQUID PELLICLE AND METHODS OF CLEANING MASKS USING PERFLUOROPOLYETHER LIQUID

(75) Inventor: Kevin Cummings, Phoenix, AZ (US)

(73) Assignee: ASML Netherlands B.V., Veldhoven (NL)

( * ) Notice: Subject to any disclaimer, the term of this patent is extended or adjusted under 35 U.S.C. 154(b) by 190 days.

(21) Appl. No.: 10/342,240

(22) Filed: Jan. 15, 2003

(65) Prior Publication Data

US 2004/0137336 A1 Jul. 15, 2004

(51) Int. Cl.
*G03F 9/00* (2006.01)

(52) U.S. Cl. .......... 430/5

(58) Field of Classification Search .......... 430/5; 257/6

See application file for complete search history.

(56) References Cited

U.S. PATENT DOCUMENTS

| | | | | | |
|---|---|---|---|---|---|
| 4,711,256 | A | | 12/1987 | Kaiser | 134/25.4 |
| 5,061,024 | A | * | 10/1991 | Keys | 359/350 |
| 5,168,001 | A | * | 12/1992 | Legare et al. | 428/194 |
| 6,280,885 | B1 | * | 8/2001 | Gordon | 430/5 |

FOREIGN PATENT DOCUMENTS

| | | |
|---|---|---|
| JP | 10308337 | 11/1998 |
| WO | WO 02/093261 A1 | 11/2002 |

OTHER PUBLICATIONS

M. Switkes et al., "Resolution Ehancement of 157 nm Lithography by liquid Immersion," Proceedings of SPIE, vol. 4691, 2002, pp. 459–465.

* cited by examiner

*Primary Examiner*—Christopher G. Young
(74) *Attorney, Agent, or Firm*—Pillsbury Winthrop Shaw & Pittman, LLP

(57) ABSTRACT

A patterning device, for example a mask, for use in a photolithographic apparatus includes a blank layer, a layer of patterned opaque material on a surface of the blank layer and a pellicle of perfluoropolyether (PFPE) liquid that covers the surface. A method of manufacturing a patterning device includes providing a patterning device having a blank layer and a patterned layer of opaque material on a surface of the blank layer, applying PFPE liquid to the surface that covers the surface to form a PFPE liquid layer, and removing at least a portion of the PFPE liquid layer. A method of cleaning a patterning device for use in photolithographic projection apparatus, the patterning device including a blank layer and a patterned layer of opaque material on a surface of the blank layer, the method including applying PFPE liquid to the surface of the blank layer that covers the surface to form a PFPE liquid layer and removing at least a portion of the PFPE liquid layer.

13 Claims, 8 Drawing Sheets

PERFLUOROPOLYETHER LIQUID PELLICLE AND METHODS OF CLEANING MASKS USING PERFLUOROPOLYETHER LIQUID

BACKGROUND OF THE INVENTION

1. Field of the Invention

The present invention relates to pellicles for masks used in photolithographic projection apparatus and methods of cleaning masks.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device. An example of such a patterning device is a mask. The concept of a mask is well known in lithography, and it includes mask types such as binary, alternating phase shift, and attenuated phase shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U. S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step and scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally $<1$), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement and/or inspection of the imaged features. This array of procedures is used as a basis to pattern an individual layer of a device, e.g. an IC. Such a patterned layer may then undergo various processes such as etching, ion-implantation (doping), metallization, oxidation, chemical, mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-0067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

Referring to FIG. 2, a mask 10 used in a photolithographic projection apparatus typically includes a glass or quartz blank 11 having a patterned layer 12 of opaque material, for example chrome, formed on one surface. A pellicle 20 is provided to prevent contaminants, such as dust particles, from contacting the mask 10. Any contaminants on the mask 10 will alter the desired pattern to be imaged. The pellicle 20 includes a frame 21 attached to the blank 11 and a membrane 22 attached to the frame 21. The membrane 22 is positioned at a height H above the patterned layer that is larger than the focal length of the radiation imaged onto the mask 10 so as not to block radiation from reaching the mask. Any contaminants on the membrane 22 are also spaced above the mask 10 so as to be out of focus and not adversely affect the image of the pattern.

The membrane 22 may be formed by applying an anti-reflective coating to a fluoropolymer film or by spinning a polymer solution having a sufficient viscosity on a suitable film. The anti-reflective coating applied to the fluoropolymer film may be formed by spinning. The film must be relatively thick to withstand the forces associated with the spinning process. The thickness of the membrane 22 directly affects transmission of the radiation through the membrane 22 to the mask 10. Absorption and reflection of the radiation by the membrane 22 reduce the transmission of radiation to the mask 10 and prevent all of the radiation from being used in the photolithographic process. The membrane 22 must be thick enough to have mechanical strength sufficient to be spin coated, lifted and adhesively mounted to the frame 21. The pellicle 20 shown in FIG. 2, including the polymer film and spin coated coating, is generally referred to as a soft pellicle to distinguish from a quartz pellicle, which is generally referred to as a hard pellicle. Hard pellicles are generally more expensive than soft pellicles and may act as an additional optical element, which may adversely affect the imaging and overlay performance of photolithographic projection apparatus. Soft pellicles, although less expensive to manufacture, can introduce optical distortions due to bending or sagging of the membrane. Soft pellicles are also less durable than hard pellicles and may require replacement more frequently than hard pellicles.

The membrane 22 is generally fragile and easily destroyed by conventional mask cleaning processes. Conventional cleaning processes may include spraying a cleaning fluid, for example de-ionized water or ammonium hydroxide, on the mask 10, spinning the mask 10 to remove excess cleaning fluid, and a rinse spray. The membrane 22 is often removed prior to cleaning the mask and then reattached to the frame 21. The mask 10 must then be requalified for use in a photolithographic projection apparatus. Each pellicle is built to match a particular mask. The process of removing the membrane 22, cleaning the mask 20, reattaching the membrane 22 to the frame 21 and requalifying the mask 10 is time consuming and costly. Nonuniformities in the thickness and roughness of the pellicle membrane also cause nonuniformities in the membrane's transmission of the radiation. Film thickness must be precisely controlled to allow operation at the fringe maxima for the radiation wavelength.

The trend toward smaller integrated circuit devices requires lithographic projection apparatus that can print patterns having features of even smaller critical dimensions (CD) than those currently printed using 248 nm and 193 nm radiation. Lithographic projection apparatus utilizing 157 nm radiation are currently being developed to print pattern features having CD's as small as 70–100 nm. However, known polymers currently used for pellicle membranes in 248 nm and 193 nm photolithography are not suitable for use in 157 nm photolithography. Commercially available fluoropolymers, such as TEFLON® AF and CYTOP®, rapidly burst under irradiation by 157 nm radiation because they lack sufficient mechanical integrity.

Fluoropolymers currently being developed have sufficient transparency to produce transmission rates above 95%. Upon irradiation the fluoropolymers undergo photochemical darkening, which reduces the transmission rate and the useful life of the pellicle membrane. It is generally assumed that the useful life of the pellicle increases uniformly with increasing transparency. However, TEFLON® AF (TAFx) polymers developed by DuPont for use as pellicles in 157 nm photolithography have shown that materials with different absorptions have similar useful lifetimes and polymers with similar absorptions have different useful lifetimes. Ideally, a pellicle for use in 157 nm photolithography should be at least 98% transparent and resist photochemical darkening to remain useful for an exposure lifetime of 7.5 $kJ/cm^2$.

It is important that fluoropolymers used as pellicles for 157 nm photolithography have the required optical properties (i.e., transparency and absorption), film formation characteristics and mechanical and photochemical radiation durability. The fluoropolymers must also have low optical absorptions necessary to produce minimal outgassing and be compatible with noncontaminating adhesives used to attach the membrane to the pellicle frame, the gasket material used to attach the pellicle frame to the mask and the material of the pellicle frame. Because optical absorption caused by air is four orders of magnitude higher at 157 nm than at 193 nm, the entire exposure system needs to be designed and maintained contaminant free. The optical path, including the wafer and mask stages, can be exposed to only part per million concentrations of oxygen, water and organic molecules. An additional molecular cleaning step is needed before the mask is exposed. Current mask cleaning techniques include purging with gas, for example nitrogen. The purging process increases production cost and time of integrated circuit devices produced using photolithographic projection apparatus.

SUMMARY OF THE INVENTION

It is an aspect of the present invention to provide patterning devices with pellicles that are usable with photolithographic projection apparatus that provides a patterned beam or radiation, including 157 nm radiation, to print patterns on a substrate, it is also an aspect of the present invention to provide methods of manufacturing and cleaning patterning devices having pellicles that are usable with photolithographic projection apparatus that provides a patterned projection beam of radiation, including 157 nm radiation, to print patterns on a substrate.

This and other aspects are achieved according to the invention in a patterning device for use in lithographic projection apparatus, the patterning device including a blank layer formed of one of quartz, glass, MgF or $CaF_2$; a patterned layer of opaque material on a surface of the blank layer; and a layer of perfluoropolyether (PFPE) liquid on the surface of blank layer that covers the surface.

According to a further aspect of the invention there is provided a method of manufacturing a patterning device for use in photolithographic apparatus, the method including providing a patterning device having a blank layer and a patterned layer of opaque material on a surface of the blank layer; applying perfluoropolyether (PFPE) liquid to the surface of the blank layer that covers the surface to form a PFPE liquid layer; and removing at least a portion of the PFPE liquid layer.

According to a still further aspect of the present invention there is provided a method of cleaning a patterning device for use in photolithographic projection apparatus, the patterning device including a blank layer and a patterned layer of opaque material on a surface of the blank layer, the method including applying perfluoropolyether (PFPE) liquid to the surface of the blank layer that covers the surface to form a PFPE liquid layer; and removing at least a portion of the PFPE liquid layer.

According to a still further aspect of the invention there is provided a device for use in integrated circuits, integrated optical systems, patterns for magnetic domain memories, liquid-crystal display panels, and thin-film magnetic heads, the device manufactured by a method including providing a substrate that is at least partially covered by a layer of radiation sensitive material; providing a projection beam of radiation; endowing the projection beam with a pattern in its cross section using a patterning device according to the present invention; and projecting the patterned beam of radiation onto a target portion of the layer of radiation sensitive material.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. and one of ordinary skill in the art will appreciate that, in the context of such alternative applications, any use of the terms “reticle”, “wafer” or “die” in this text should be considered as being replaced by the more general terms “mask”, “substrate” and “target portion”, respectively.

In the present document, the terms “radiation” and “beam” are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
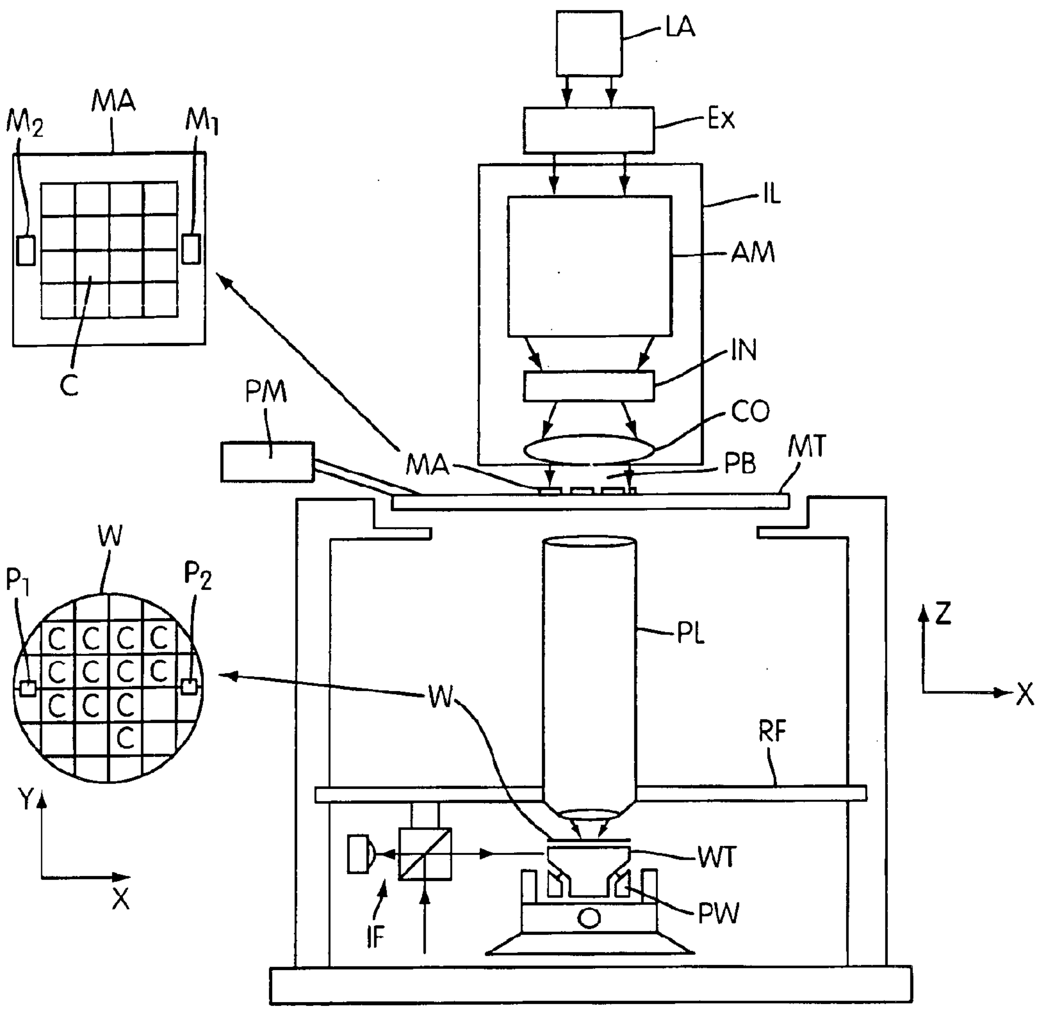
FIG. 1 is a schematic illustration of a photolithographic projection apparatus.

FIG. 1 schematically depicts a lithographic projection apparatus according to a particular embodiment of the invention. The apparatus includes a radiation system Ex. IL that supplies a beam PB of radiation (e.g. UV or EUV radiation, such as, for example, generated by an excimer laser operating at a wavelength of 248 nm, 193 nm or 157 nm, or by a laser-fired plasma source operating at 13.6 nm). In this embodiment, the radiation system also comprises a radiation source LA. The apparatus also includes a first object table (mask table) MT provided with a mask holder for holding a mask MA (e.g. a reticle), and connected to a first positioning device PM to accurately position the mask with respect to a projection system PL; a second object table (substrate table) WT provided with a substrate holder for holding a substrate W (e.g. a resist-coated silicon wafer), and connected to a second positioning device PW to accurately position the substrate with respect to the projection system PL; the projection system or lens PL (e.g. a quartz and/or $CaF_2$ lens system or a refractive or catadioptric system, a mirror group or an array of field deflectors) constructed and arranged to image an irradiated portion of the mask MA onto a target portion C (e.g. comprising one or more dies) of the substrate W. The projection system PL is supported on a reference frame RF. As here depicted, the apparatus is of a transmissive type (i.e. has a transmissive mask). However, in general, it may also be of a reflective type, for example with a reflective mask. Alternatively, the apparatus may employ another kind of patterning device, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or iron beam source) produces radiation. The radiation is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer an σ-inner, respectively) of the intensity distribution in the beam. In addition, it will generally comprise various other components, such as an integrator IN and a condenser CO. In this way,the beam PB impinging on the mask MA has a desired uniformity and intensity distribution in its cross-section.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device PW (and interferometer IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g. the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 3:
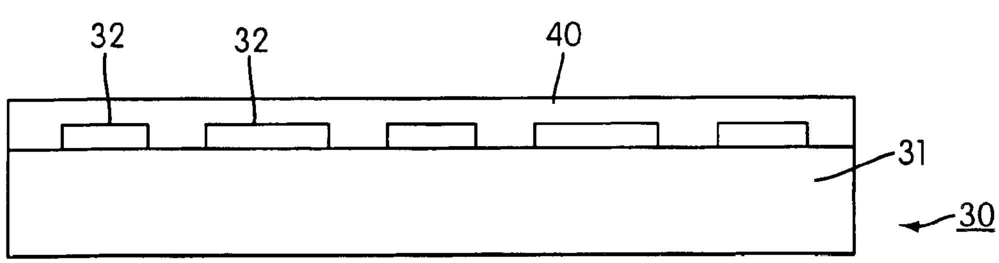
FIG. 3 is a schematic illustration of a mask and pellicle according to an exemplary embodiment of the present invention.

Referring to FIG. 3, an exemplary embodiment of a mask 30 according to the present invention includes a blank layer 31 and a patterned opaque layer 32, i.e. a hard mask. The hard mask 32 may be formed, for example, of chrome. As conventional quartz and glass (e.g., borosilicate glass or fused silica glass) are opaque at 157 nm, the blank layer 31 is formed of $CaF_2$. It should be appreciated that the blank layer 31 may be formed of quartz or glass in photolithographic projection apparatus using radiation of 193 nm or 248 nm.

A pellicle 40 of perfluoropolyether (PFPE) liquid is formed on the mask 30. The PFPE liquid may be, for example, FOMBLIN® or GALDEN®, available from Ausimont Corporation, or KRYTOX®, available from DuPont. PFPE liquids are currently used as lubricants in vacuum pumps and thus are compatible with clean room environments in which photolithographic projection apparatus are used. PFPE liquids are optically clean, non-toxic, chemically inert, and compatible with at least some current resist materials. PFPE liquids have a 157 nm absorbance $\alpha=10^{-3}$ $\mu m^{-1}$ base 10, which is a thousands times lower than current experimental 157 nm resists and ten times lower than current 157 nm pellicle materials.

Figure 2:
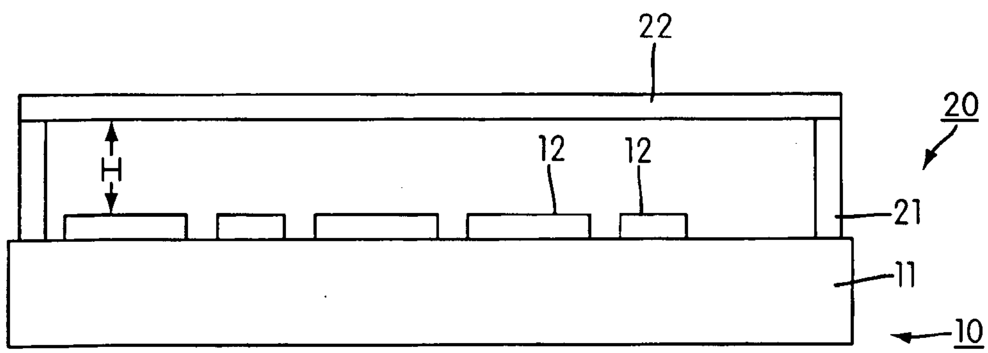
FIG. 2 is a schematic illustration of a mask and pellicle according to a known construction.

PFPE liquids also have an index of refraction that is more closely matched to $CaF_2$ used for mask blanks in 157 nm photolithography. Referring again to FIG. 2, air occupies the space between the membrane 22 and the blank 11. Air has an index of refraction n=1.0. The difference between the index of refraction of the membrane 22 and the index of refraction of air is relatively large, as is the difference between the index of refraction of air and the index of refraction of the blank 11. These relatively large differences between the indices of refraction result in increased reflection of the radiation and a decrease in the amount of radiation through the mask. In general, the greater the difference between the indices of refraction the greater the reflection is. Current films including anti-reflective coatings used as pellicle membranes have an index of refraction between 1.13 to 1.2. The difference between the pellicle membrane index of refraction and air is thus between 0.13 and 0.2.

Referring again to FIG. 3, the index of refraction of $CaF_2$ is approximately 1.56. FOMBLIN® Z-25 has an index of refraction at 157 nm of n=1.35. FOMBLIN® Y-18 has an index of refraction at 157 nm of n=1.37. FOMBLIN® Y-140, a higher molecular weight version, has an index of refraction at 157 nm of n=1.38. The difference between the index of refraction of the $CaF_2$ blank 31 and the liquid pellicle 40 thus may be between 0.18 to 0.21, which is comparable to the difference available with current films with anti-reflective coatings used as pellicle membranes. In addition, the difference in the indices of refraction can be reduced, or eliminated, by the use of a suitable coating on the final optical element of the photolithographic projection apparatus.

PFPE liquids are chemical and solvent resistant. They also have excellent thermal and electrical resistance and are non-reactive with metal, plastic, elastomers and rubber. PFPE liquids are inert to liquid and gaseous oxygen and are nonflammable. Because PFPE liquids can withstand high oxygen conditions, they are suitable for use as pellicles in the production of masks as they will not be affected by the high oxygen conditions found in photo-resist stripping processes. PFPE liquids can also withstand Lewis acids produced during aluminum etching, products from sulfur, most acids, most bases and most oxidizing agents. They are available in a variety of viscosities and have low evaporation loss. PFPE liquids also have excellent radiation hardness and resistance to polymerization in the presence of ionizing radiation. PFPE liquids have zero ozone depletion potential and are not classified as volatile organic chemicals by the Environmental Protection Agency.

Figure 4:
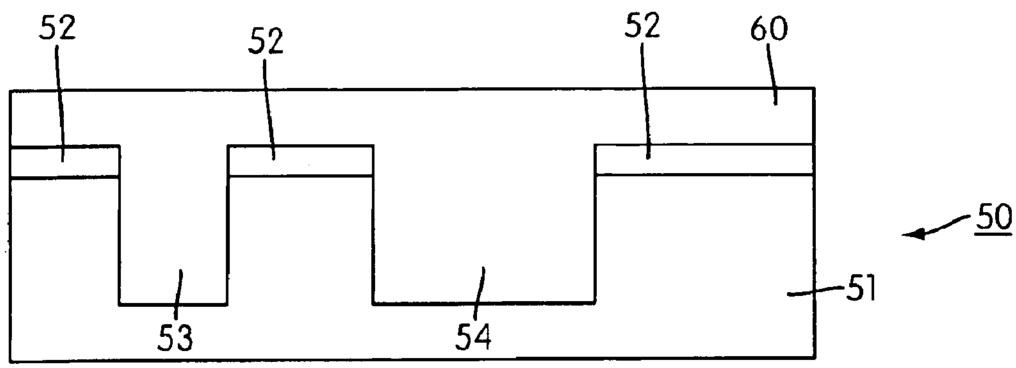
FIG. 4 is a schematic illustration of a mask and pellicle according to another exemplary embodiment of the present invention.

Referring to FIG. 4, an alternating or attenuating phase shift mask 50 according to an exemplary embodiment of the present invention includes a mask blank including a blank layer 51 and an opaque layer, i.e. a hard mask 52. As discussed above, the blank layer 51 may be formed of $CaF_2$, MgF, F-doped quartz or glass, or any other material having optical properties suitable for 157 nm lithography, and may be formed of glass or quartz for 193 nm or 248 nm lithography. A pattern having features 53 and 54 is formed in the mask 50. The mask 50 may be manufactured by any known process, including applying a radiation sensitive material, e.g. resist, to the mask blank, exposing the resist to a patterned projection beam of radiation, removing the hard mask, and forming the pattern by etching, either wet or dry.

Figure 5:
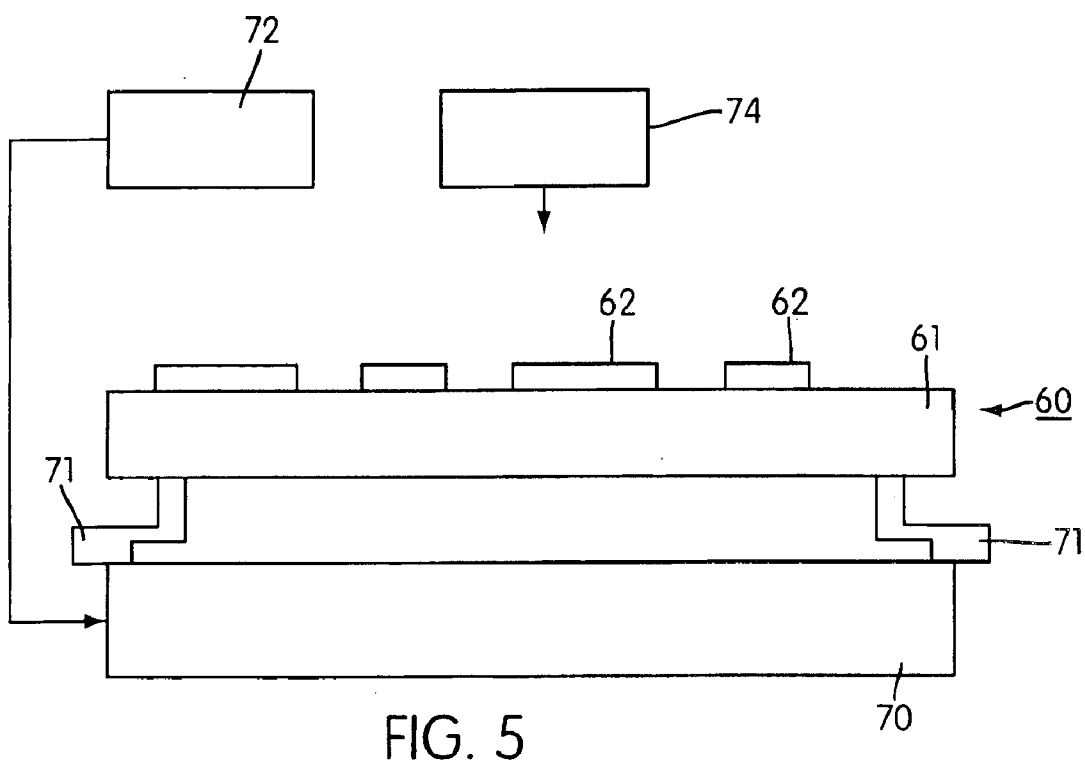
FIGS. 5–7 are schematic illustrations of an apparatus according to an exemplary embodiment of the present invention capable of manufacturing pellicles according to the present invention on masks.

Referring to FIG. 5, an exemplary embodiment of an apparatus for forming a pellicle on a mask 60, including a blank layer 61 and a patterned opaque layer 62, includes a spin chuck 70 and mask supports 71. A rotary drive 72 is operatively connected to the spin chuck 70. A PFPE liquid source 74 is arranged to supply PFPE liquid to the surface of the mask 60 the mask having the patterned opaque layer 62 thereon. The source 74 may be a spraying mechanism, a nozzle, or a dosing arm, for example.

Figure 6:
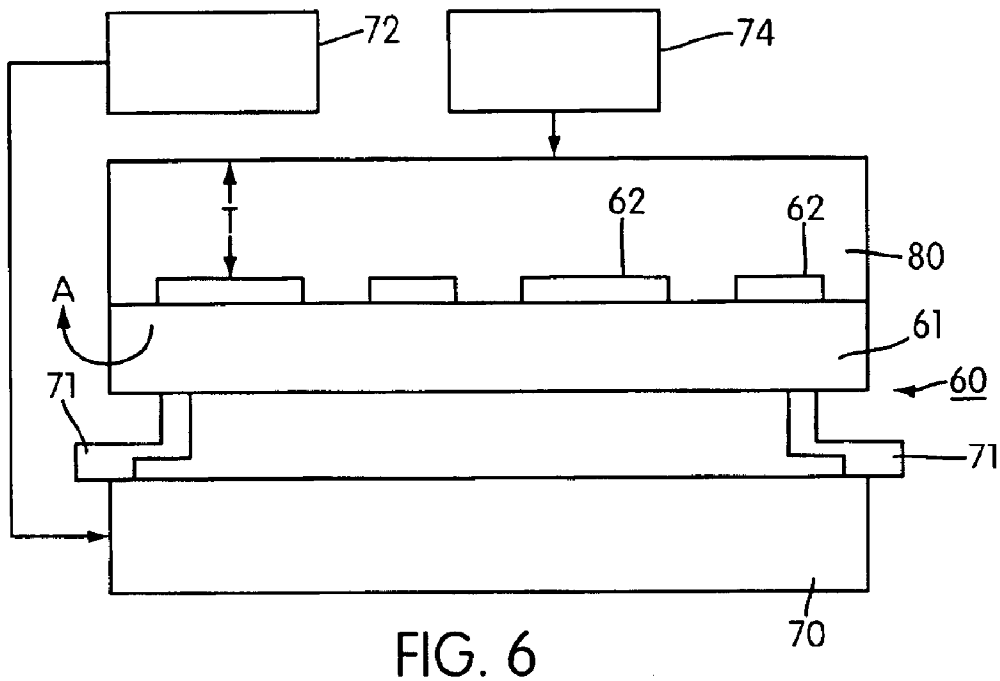

Referring to FIG. 6, the source 74 supplies PFPE liquid 80 to the mask 60 to cover the surface of the mask 60 that includes the patterned opaque layer 62. The PFPE liquid 80 is applied to the mask 60 to a thickness T that is greater than the thickness H at which contaminants on the PFPE liquid 80 will not block radiation passing through the mask 60 and will be out of focus so as to not affect the image of the pattern.

Figure 7:
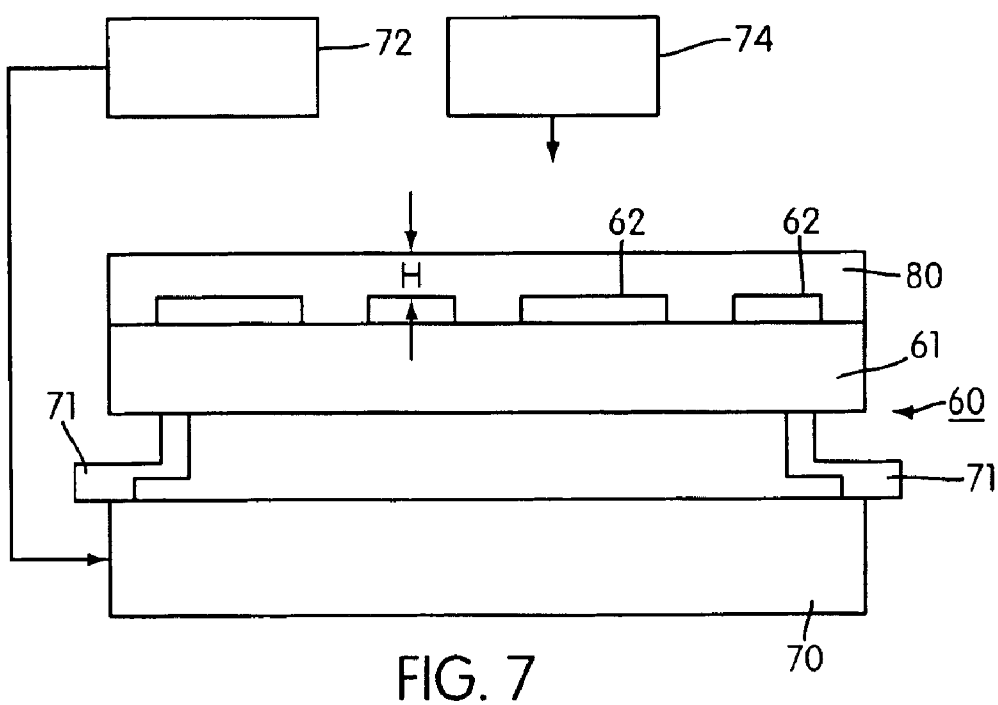

As shown by arrow A in FIG. 6, the spin chuck 70 is rotated by the rotary drive 72 to spin off excess PFPE liquid 80. Excess PFPE liquid 80 may be spun off until the liquid thickness H above the patterned opaque layer 62 is equal to or slightly larger than the focal length of the radiation to be imaged on the mask 60, as shown in FIG. 7. The amount of liquid spun off may be controlled by controlling the rotary drive 72 to control the speed of the spin chuck 70 and/or by controlling the rotary drive 72 to control the spin time of the spin chuck 70. The thickness of the PFPE liquid 80 can be determined by known measurement/inspection devices. Spinning the mask 60 also provides increased control over the uniformity of the thickness of the PFPE liquid 80.

Figure 8:
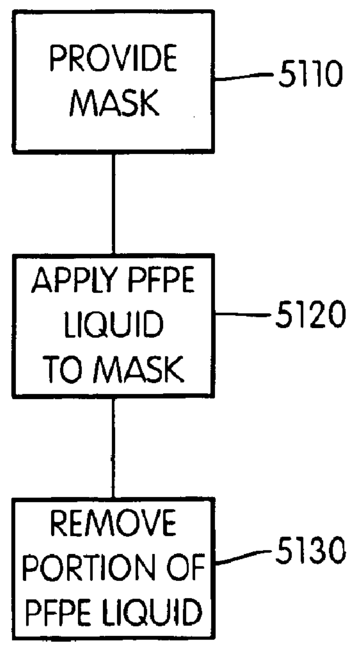
FIG. 8 is a schematic illustration of a method of forming a pellicle on a mask according to an exemplary embodiment of the present invention.

Referring to FIG. 8, a method of forming a pellicle according to an exemplary embodiment of the present invention includes providing a mask S110, applying PFPE liquid S120, and removing a portion of PFPE liquid S130 to adjust the thickness of the PFPE liquid on the mask. It should be appreciated that the method may be used to form a pellicle on any type of mask, including, for example, attenuating phase shift masks, alternating phase shift masks, binary masks and hybrid masks. It should also be appreciated that the PFPE liquid may be removed by methods other than spinning, such as, for example, by agitation (e.g., repetitive reciprocal motion of the mask), chemical reaction, or by passing the mask with the applied PFPE liquid under a member, such as a blade, having an edge at a predetermined distance from the mask.

Figure 9:
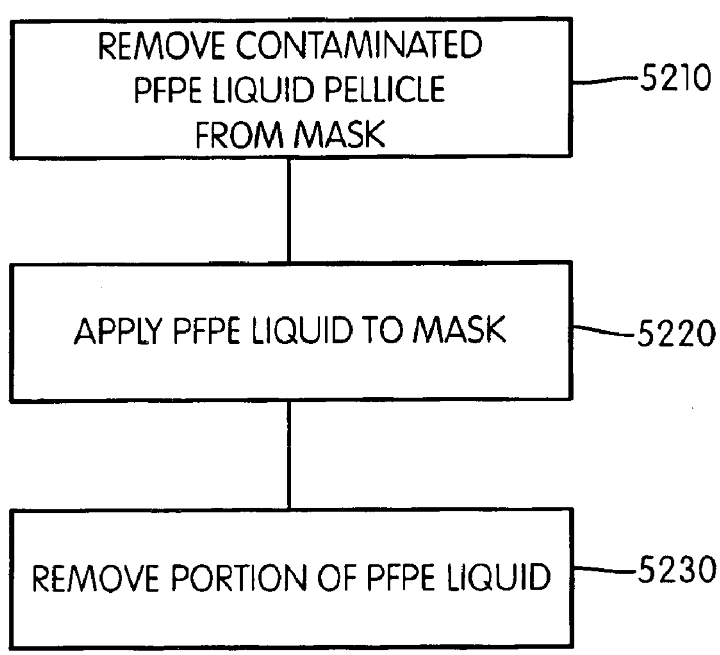
FIG. 9 is a schematic illustration of a method according to an exemplary embodiment of the present invention for cleaning masks provided with pellicles according to the present invention.

The apparatus shown in FIGS. 5–7 may also be used to clean masks by removing pellicles of PFPE liquid that have been contaminated and replacing the contaminated pellicle with a new pellicle of PFPE liquid. Referring to FIG. 9, a method of cleaning a mask according to an exemplary embodiment of the present invention includes removing a contaminated PFPE liquid pellicle S210, applying PFPE liquid to the mask S220, and removing a portion of the PFPE liquid S230 to adjust a thickness of the PFPE liquid on the mask. As discussed above, the contaminated PFPE liquid pellicle may be removed by any method, such as spinning or agitating. The portion of the PFPE liquid applied as a new, clean pellicle may be removed by, for example, spinning or agitating or by passing the mask under the edge of a blade.

Figure 10:
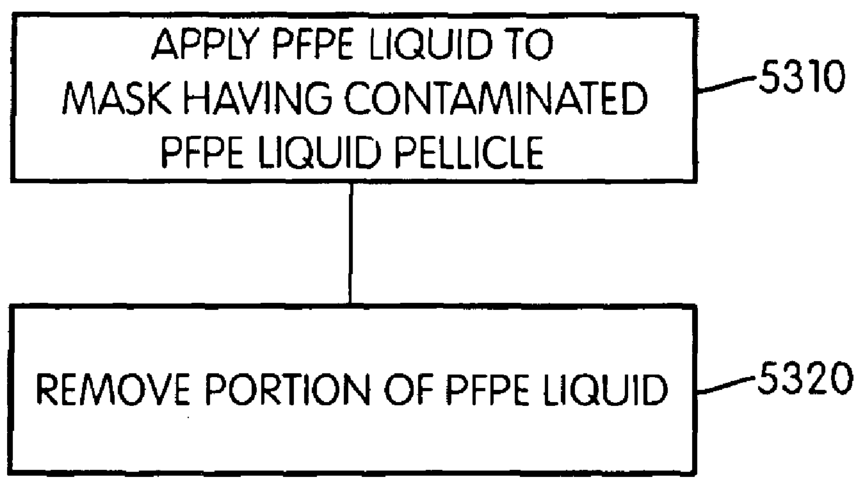
FIG. 10 is a schematic illustration of a method according to another exemplary embodiment of the present invention for cleaning masks provided with pellicles according to the present invention.

Referring to FIG. 10, another exemplary method of cleaning a mask according to the present invention includes applying PFPE liquid to a mask having a contaminated PFPE liquid pellicle S310 and removing a portion of PFPE liquid S320 to adjust the thickness of the PFPE liquid on the mask. In this second exemplary embodiment, the contaminated PFPE pellicle is not removed before application of clean PFPE liquid. The contaminated PFPE liquid pellicle is displaced by the application of clean PFPE liquid. The mask may be spun or agitated simultaneously with the application of clean PFPE liquid or may be spun or agitated after application of an amount of clean PFPE liquid sufficient to displace the contaminated PFPE liquid pellicle.

Figure 11:
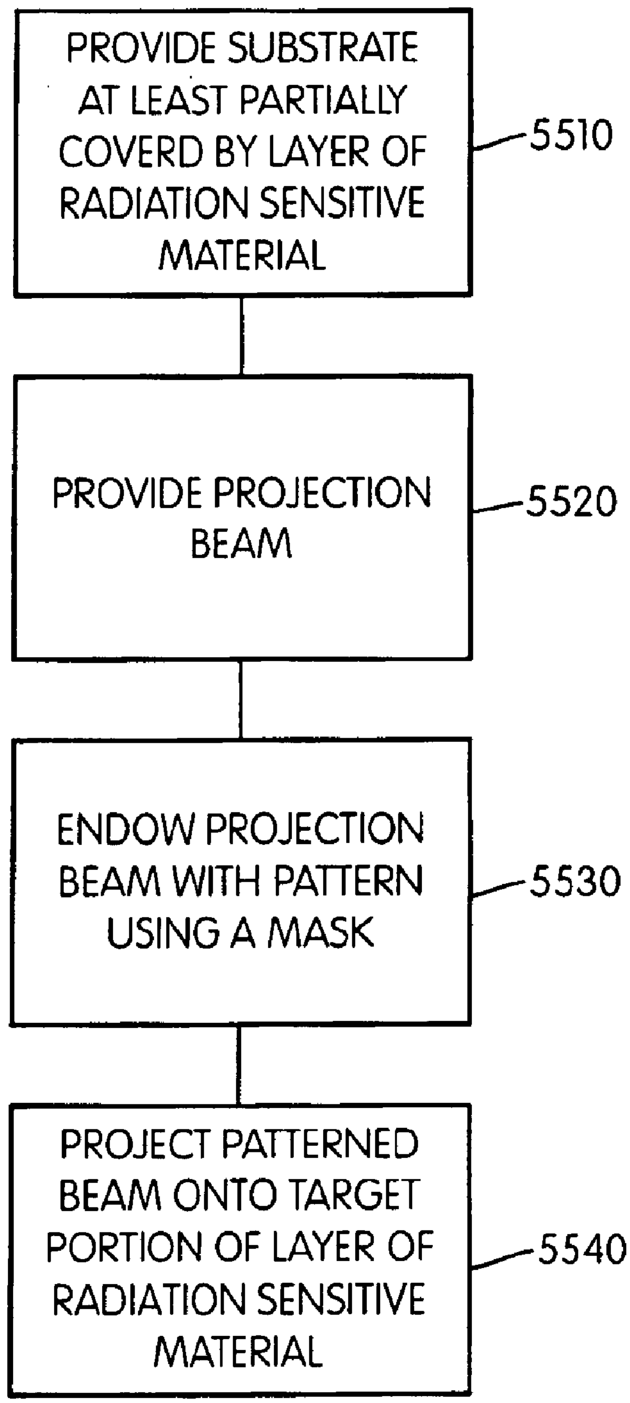
FIG. 11 is a schematic illustration of a method for manufacturing a device for use in an integrated circuit, an integrated optical system, a magnetic domain memory, a liquid crystal display panel, or a thin film magnetic head.

Referring to FIG. 11, a method for manufacturing a device for use in an integrated circuit, an integrated optical system, a magnetic domain memory, a liquid-crystal display panel, or a thin-film magnetic head includes providing a substrate that is at least partially covered by a layer of radiation sensitive material S510, providing a projection beam of radiation using a radiation system S520, endowing the projection beam with a pattern in its cross section using a mask having a pellicle according to an exemplary embodiment of the present invention S530, and projecting the patterned beam of radiation onto a target portion of the layer of radiation sensitive material S540.

Figure 12:
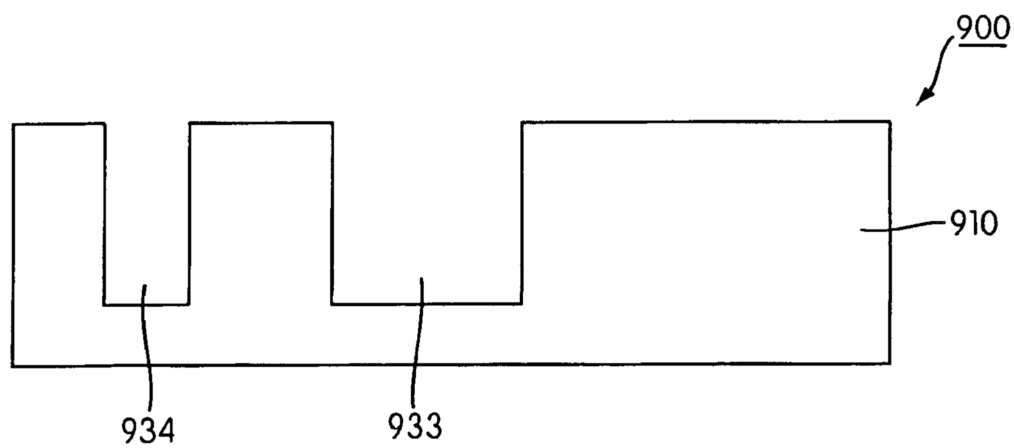
FIG. 12 is a schematic illustration of a device for use in an integrated circuit, an integrated optical system, a magnetic domain memory, a liquid crystal display panel, or a thin film magnetic head use in an integrated circuit, an integrated optical system, a magnetic domain memory, a liquid crystal display panel, or a thin film magnetic head manufactured by a method according to the present invention.

Referring to FIG. 12, a device 900 manufactured by an exemplary method according to the present invention includes a substrate 910 having a pattern including features 933, 934 formed therein. As discussed above, it should be appreciated that the device 900 may be formed in the manufacture of integrated circuits, integrated optical systems, magnetic domain memories, liquid-crystal display panels, and thin-film magnetic heads. It should also be appreciated that the device 900 may include a plurality of patterned layers that may be formed by repeating the method or a variant thereof.

Masks including PFPE liquid pellicles according to the present invention increase the production capacity of photolithographic projection apparatus. Cleaning of the masks by removing or displacing a contaminated PFPE liquid pellicles can be done in less time than cleaning of masks having pellicle frames and membranes, which may also be damaged or destroyed during the cleaning process. This reduced cleaning time allows the mask to be removed, cleaned and replaced in the photolithographic apparatus for production of patterned wafers in less time than conventional masks including pellicle frames and membranes. Masks including PFPE liquid pellicles according to the present invention also do not require special packaging to protect the mask or the pellicle. The mask may be shipped or stored with a PFPE liquid pellicle, which may easily be replaced by a contaminant free PFPE liquid pellicle prior to use in a photolithographic projection apparatus. Methods of cleaning masks according to the present invention are also preferable over current methods using de-ionized water as any de-ionized water remaining on the mask after cleaning will absorb 157 nm radiation and adversely affect the imaging of the pattern.

While specific embodiments of the invention have been described above, it will be appreciated that the invention may be practiced otherwise than as described. The description is not intended to limit the invention.

What is claimed is:

1. A patterning device far use in lithographic projection apparatus, comprising:

a blank layer;

a patterned layer of opaque material on a surface of the blank layer; and a layer of perfluoropolyether (PFPE) liquid on the surface of the blank layer that covers the surface and the patterned layer.

2. A patterning device according so claim 1, wherein a difference between an index of refraction of the blank layer and an index of refraction of the PFPE liquid layer is less than or equal to 0.21.

3. A patterning device according to claim 1, wherein she blank layer includes a pattern corresponding to the pattern in the opaque material layer.

4. A patterning device according to claim 1, wherein the blank layer is formed of quartz, glass, MgF, or $CaF_2$.

5. A method of manufacturing a patterning device for use in photolithographic apparatus, the method comprising:

providing a patterning device having a blank layer and a patterned layer of opaque material on a surface of the blank layer, applying perfluoropolyether (PFPE) liquid to the surface of the blank layer that covers the surface and the patterned layer to form a PFPE liquid layer; and removing a portion of the PFPE liquid layer, wherein removing the portion of PFPE liquid layer includes removing the portion to adjust a thickness of the PFPE liquid layer above the patterned layer.

6. A method according to claim 5, wherein a difference between an index of refraction of the blank layer and an index of refraction of the PFPE liquid layer is less than or equal to 0.21.

7. A method according to claim 5, wherein the blank layer has a pattern corresponding to the pattern in the opaque material layer.

8. A method according to claim 5, wherein removing the portion of the PFPE liquid layer includes spinning or agitating the mask.

9. A method of cleaning a patterning device for use in photolithographic projection apparatus, the patterning device including a blank layer and a patterned layer of opaque material on a surface of the blank layer, the method comprising:

applying perfluoropolyether (PFPE) liquid to the surface of the blank layer that covers the surface and the patterned layer to form a PFPE liquid layer; and removing a portion of the PFPE liquid layer, wherein removing the portion of PFPE liquid layer includes removing the portion to adjust a thickness of the PFPE liquid layer above the patterned layer.

10. A method according to claim 9, further comprising removing a contaminated PFPE liquid layer from the surface prior to applying the PFPE liquid layer.

11. A method according to claim 9, wherein a difference between an index of refraction of the blank layer and an index of refraction of the PFPE liquid layer is less than or equal to 0.21.

12. A method according to claim 9, wherein the blank layer has a pattern corresponding to the pattern in the opaque material layer.

13. A method according to claim 9, wherein removing the portion of the PFPE liquid layer includes spinning or agitating the mask.

* * * * *